(12) United States Patent
Fuhrmann et al.

(10) Patent No.: US 11,688,819 B2
(45) Date of Patent: Jun. 27, 2023

(54) SOLAR CELL STACK

(71) Applicant: AZUR SPACE Solar Power GmbH, Heilbronn (DE)

(72) Inventors: Daniel Fuhrmann, Heilbronn (DE); Wolfgang Guter, Stuttgart (DE)

(73) Assignee: AZUR SPACE Solar Power GmbH, Heilbronn (DE)

(*) Notice: Subject to any disclaimer, the term of this patent is extended or adjusted under 35 U.S.C. 154(b) by 0 days.

(21) Appl. No.: 17/679,929

(22) Filed: Feb. 24, 2022

(65) Prior Publication Data

US 2022/0181510 A1 Jun. 9, 2022

Related U.S. Application Data

(62) Division of application No. 14/937,424, filed on Nov. 10, 2015, now Pat. No. 11,296,248.

(30) Foreign Application Priority Data

Nov. 10, 2014 (EP) .................................. 14003768

(51) Int. Cl.
*H01L 31/0687* (2012.01)
*H01L 31/0304* (2006.01)
(Continued)

(52) U.S. Cl.
CPC .. *H01L 31/06875* (2013.01); *H01L 31/03042* (2013.01); *H01L 31/056* (2014.12);
(Continued)

(58) Field of Classification Search
CPC .......... H02S 30/00; H02S 40/30; H02S 10/20; H01L 31/0251; H01L 31/03046;
(Continued)

(56) References Cited

U.S. PATENT DOCUMENTS

| 8,933,326 B2 | 1/2015 | Sasaki et al. | |
| 2004/0079408 A1* | 4/2004 | Fetzer | H01L 31/184 |
| | | | 136/262 |

(Continued)

FOREIGN PATENT DOCUMENTS

| CN | 102194903 A | 9/2011 |
| CN | 102782864 A | 11/2012 |

(Continued)

OTHER PUBLICATIONS

Cotal et al., "III-V Multijunction solar cells for concentrating photovoltaics," Energy & Environmental Sci., vol. 2, No. 2, pp. 174-192 (Dec. 10, 2008).

(Continued)

*Primary Examiner* — Mayla Gonzalez Ramos
(74) *Attorney, Agent, or Firm* — Muncy, Geissler, Olds & Lowe, P.C.

(57) ABSTRACT

A solar cell stack includes a first semiconductor solar cell having a p-n junction made of a first material with a first lattice constant, a second semiconductor solar cell having a p-n junction made of a second material with a second lattice constant, and the first lattice constant being at least 0.008 Å smaller than the second lattice constant, and a metamorphic buffer. The metamorphic buffer is formed between the first semiconductor solar cell and the second semiconductor solar cell. The metamorphic buffer includes a series of at least five layers. The lattice constant increases in the series in the direction of the semiconductor solar cell. The lattice constants of the layers of the metamorphic buffer are larger than the first lattice constant. Two layers of the buffer having a doping and the difference in the dopant concentration between the two layers being greater than $4E^{17}$ cm$^{-3}$.

19 Claims, 3 Drawing Sheets

(51) Int. Cl.
*H01L 31/056* (2014.01)
*H01L 31/0693* (2012.01)

(52) U.S. Cl.
CPC ...... *H01L 31/0687* (2013.01); *H01L 31/0693* (2013.01); *Y02E 10/52* (2013.01); *Y02E 10/544* (2013.01)

(58) Field of Classification Search
CPC .............. H01L 31/043; H01L 31/0687; H01L 31/06875; H01L 31/0693; H01L 31/0725; H01L 31/0735; H01L 31/18; H01L 31/184; H01L 31/1844; H01L 31/03042; H01L 31/056
See application file for complete search history.

(56) References Cited

U.S. PATENT DOCUMENTS

| | | | |
|---|---|---|---|
| 2006/0144435 A1* | 7/2006 | Wanlass | H01L 31/043 257/E27.125 |
| 2008/0203426 A1 | 8/2008 | Uemura | |
| 2010/0116327 A1 | 5/2010 | Cornfeld | |
| 2010/0122724 A1* | 5/2010 | Cornfeld | H01L 31/078 438/74 |
| 2011/0220190 A1* | 9/2011 | Lee | H01L 31/1852 136/255 |
| 2012/0138116 A1 | 6/2012 | Bhusari et al. | |
| 2012/0138130 A1* | 6/2012 | Guter | H01L 31/0687 257/104 |
| 2014/0060631 A1 | 3/2014 | Agui et al. | |
| 2015/0325711 A1* | 11/2015 | Dimroth | H01L 31/0745 136/265 |

FOREIGN PATENT DOCUMENTS

| | | |
|---|---|---|
| DE | 10 2013 000 882 B3 | 7/2014 |
| EP | 2 395 564 A1 | 12/2011 |
| WO | WO 2014/111314 A1 | 7/2014 |
| WO | WO-2014111314 A1 * | 7/2014 ......... H01L 21/0237 |

OTHER PUBLICATIONS

Li et al., "Effects of Si doping on the strain relaxation of metamorphic (Al)GaInP buffers grown on GaAs substrates," Applied Surface Sci., vol. 288, pp. 482-487 (Oct. 18, 2013).

Tangring et al., "A study of the doping influence on strain relaxation of graded composition InGaAs layers grown by molecular beam epitaxy," J. of Crystal Growth, vol. 311, No. 7, pp. 1684-1687 (Mar. 15, 2009).

Klinger et al., "Determination of hardness and Young's modulus for important II-V compound semiconductors," Thin Solid Films, vol. 548, pp. 358-365 (Aug. 29, 2013).

Wolfgang Guter, Optimierung von III-V basierten Hochleistungssolarzellen (Optimizing III-V-based high-efficiency solar cells), Dissertation, Univ. of Constance, Dept. of Physics, pp. 1-172 (2010).

Meusel et al., "II-V Multijunction Solar Cells—From Current Space and Terrestrial Products to Modern Cell Architectures," $5^{th}$ World Photovoltaic Energy Conf., Valencia, Spain, pp. 1-6 (Sep. 2010).

Guter et al., "Development, Qualification and Production of Space Solar Cells with 30% EOL Efficiency," European Space Power Conf., Noodwijkerhout, the Netherlands, pp. 1-4 (Apr. 2014).

Cornfeld et al., "Development of a Four Sub-Cell Inverted Metamorphic Multi-junction (IMM) Highly Efficient AM0 Solar Cell," $35^{th}$ IEEE PVSC, Honolulu, HI, USA, pp. 1-5 (2010).

Chinese Search Report for Chinese Application No. 201510763317.5—English translation.

Tobias Roesener "Hocheffiziente III-V-Mehrfachsolarzellen auf Silicium Substrat", Dissertation, 26. Jun. 2013, XP055155900, URL:http://www.reiner-lemoine-stiftung.de/pdf/dissertationen/dissertation roesener.pdf; relevant sections cited in European Office Action dated Jun. 13, 2018: Abb. 1.1:, pp. 3-4, pp. 138-140.

European Search Report dated Jun. 13, 2018 in corresponding application 14003768.0—partial translation identifies relevant portion of cited document Tobias Roesener "Hocheffiziente III-Mehrfachsolarzellen auf Silicium Substrat".

* cited by examiner

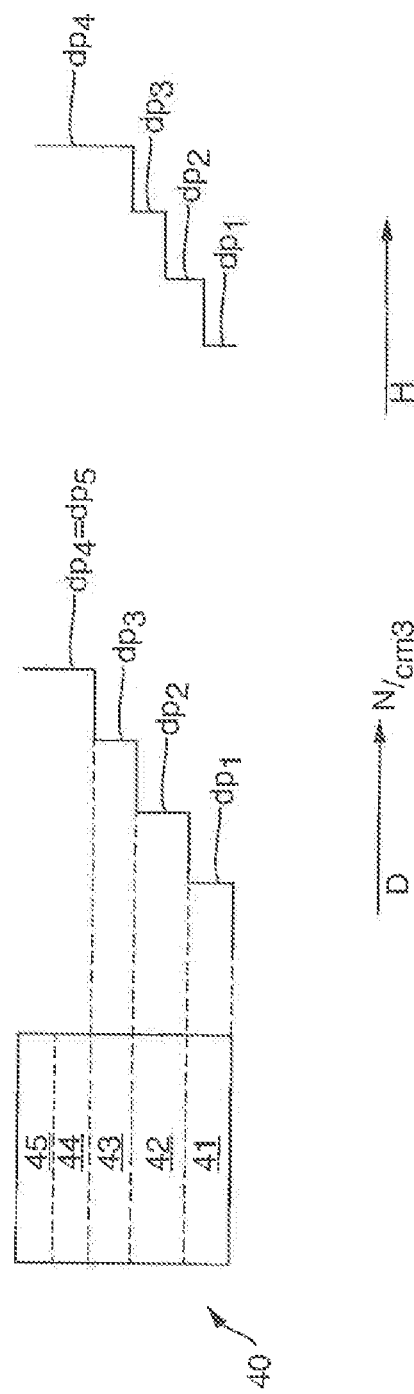

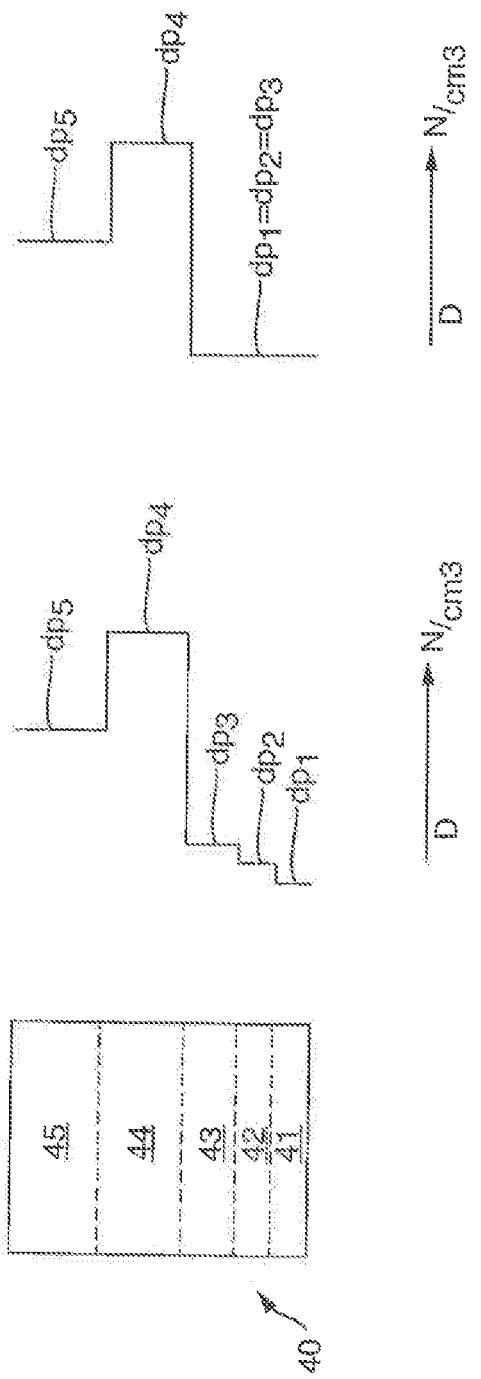

SOLAR CELL STACK

This nonprovisional application is a Continuation application of U.S. application Ser. No. 14/937,424, filed on Nov. 10, 2015, which claims priority under 35 U.S.C. § 119(a) to European Patent Application No. 14003768.0, which was filed in Germany on Nov. 10, 2014, and which are both herein incorporated by reference.

BACKGROUND OF THE INVENTION

Field of the Invention

The present invention relates to a solar cell stack.

Description of the Background Art

To achieve preferably high efficiencies for converting sunlight into electrical energy using solar cells, multijunction solar cells made of different semiconductor materials have been studied for a number of years now [W. Guter, Optimierung von III-V basierten Hochleistungssolarzellen (Optimizing III-V-based high-efficiency solar cells), Dissertation, University of Constance, Department of Physics, 2011]. Multijunction solar cells distribute the incident light to multiple solar subcells which are stacked on top of each other and have different bandgap energies. To achieve the highest efficiencies, the semiconductor materials and their bandgap energy must be adapted to each other, so that each of the electrically series-connected solar subcells preferably generates the same current.

If the semiconductor materials of the individual subcells of the stack have the same lattice constant, the subcells may be manufactured using an epitactical method. A lattice-matched 4-junction solar cell made of AlInGaP, InGaAs, InGaNAs and Ge is known from Meusel et al., III-V MULTIJUNCTION SOLAR CELLS—FROM CURRENT SPACE AND TERRESTRIAL PRODUCTS TO MODERN CELL ARCHITECTURES, 5th WCPEC, 2010, Valencia, 1AP.1.5. Only inadequate efficiencies are achieved, in particular by the InGaNAs subcell, due to the crystal quality.

If the subcells have different lattice constants, metamorphic buffer layers are inserted between two subcells in a first alternative. A series of subcells made of AlInGaP, AlInGaAs, InGaAs, a metamorphic buffer and Ge is known from Guter et al., DEVELOPMENT/QUALIFICATION AND PRODUCTION OF SPACE SOLAR CELLS WITH 30% EOL EFFICIENCY, European Space Power Conference, 2014, Noordwijkerhout, The Netherlands. Furthermore, another series of subcells made of InGaP/GaAs and having a first metamorphic buffer, a first InGaAs subcell and a second metamorphic buffer and a second InGaAs subcell is known from Cornfeld et al., Development of a four subcell inverted metamorphic multijunction (IMM) highly efficient AM0 solar cell, 35th IEEE PVSC, 2010, Honolulu, USA.

SUMMARY OF THE INVENTION

It is therefore an object of the present invention to provide a device which refines the prior art.

According to an exemplary embodiment of the invention, a solar cell stack is provided, comprising a first semiconductor solar cell, the first semiconductor solar cell having a p-n junction made of a first material with a first lattice constant, and a second semiconductor solar cell, the second semiconductor solar cell having a p-n junction made of a second material with a second lattice constant, and the first lattice constant being at least 0.008 Å smaller than the second lattice constant, and a metamorphic buffer, the metamorphic buffer being formed between the first semiconductor solar cell and the second semiconductor solar cell, and the metamorphic buffer including a series of three layers, and the lattice constant increasing in the series in the direction of the semiconductor solar cell, and the lattice constants of the layers of the metamorphic buffer being bigger than the first lattice constant, two layers of the buffer having a doping, and the difference in the dopant concentration between the two layers being greater than 4E17 $cm^{-3}$.

For reasons of clarity, let it be noted that the first semiconductor solar cell has a smaller lattice constant, compared to the second semiconductor solar cell. In the discussion below, the term subcell can also be used synonymously for the term semiconductor solar cell. It can be understood that the subcell having the greatest bandgap energy can be provided on the side of the solar cell stack facing the sun. In the discussion below, the term "stack-shaped integrated multijunction solar cell" can also be used synonymously for the term "solar cell stack."

After the light passes through the semiconductor solar cell having the greatest bandgap energy, the unabsorbed light, i.e., the longer-wave range, strikes the semiconductor solar cell having the lesser bandgap energy. If a carrier substrate for the solar cell stack is present, the carrier substrate is always connected to the subcell having the least bandgap energy. It should be noted that the two semiconductor solar cells are together monolithically integrated.

In the present case, the term dopant concentration can be understood to be the mean value of the dopants in the particular layer of the buffer.

An advantage is that the solar cell stack according to the invention has a high efficiency, in that two solar cells having different lattice constants are stacked on top of each other with the aid of a metamorphic buffer. Studies have shown that a doping in the area of the buffer significantly reduces the number of dislocations, i.e., the doped layers of the metamorphic buffer become harder. With the aid of a high-quality metamorphic buffer, i.e., suppressing the propagation of dislocations of the buffer into the surrounding active regions, it is possible to select the bandgap energy in such a way that the total efficiency of the solar cell stack according to the invention is increased, compared to a stack of lattice-matched solar cells.

In an embodiment, at least one layer of the metamorphic buffer can have a fourth lattice constant, the fourth lattice constant being bigger than the lattice constant of the second semiconductor solar cell. The lattice constant in the layers of the metamorphic buffer increases layer by layer by at least 0.003 Å in the direction of the second semiconductor solar cell.

In an embodiment, in two directly consecutive layers, the two layers can have a different concentration of dopants in the metamorphic buffer.

In embodiment, in two directly consecutive layers of the buffer, the difference in the concentration of the dopants can be greater than a factor of 5, preferably greater than a factor of 7, preferably no greater than a factor of 10. It can be understood that the layers of the metamorphic buffer can have either an n-doping or a p-doping.

In the metamorphic buffer, Zn and/or C and/or Mg and/or Be is/are preferably provided as the p-dopants, and Si and/or Te and/or Se is/are preferably provided as the n-dopants. The concentration of the dopants within the particular layer of the metamorphic buffer can be essentially constant, preferably constant.

In another embodiment, the metamorphic buffer can include more than three layers; the buffer can include at least five layers, preferably a maximum of at least six layers.

In an embodiment, two layers of the metamorphic buffer can have the same concentration of dopants. The two layers can be integrally connected to each other.

In an embodiment, the concentration of dopants first increases from layer to layer and subsequently decreases in a series of multiple layers of the metamorphic buffer. It is advantageous if the concentration of the dopants within the metamorphic buffer layers does not exceed 1E19 cm$^{-3}$, preferably a maximum of 0.5E19 cm$^{-3}$.

It can be understood that the metamorphic buffer layers are not part of a p-n junction of a tunnel diode.

In an embodiment, Ge or GaAs can be provided as the substrate layer, the first semiconductor solar cell and/or the second semiconductor solar cell being made of the materials Ge and/or GaAs and/or InGaAs and/or InGaP.

In an embodiment, all solar cells of the stack can be monolithically integrated, and/or an optical rear view mirror can be formed. It is understood that the optical rear view mirror can be disposed beneath the semiconductor solar cell having the least bandgap energy. It is preferred to form the optical rear view mirror from a metal. With the aid of the rear view mirror, the unabsorbed photons may be reflected back into the semiconductor solar cell having the least bandgap energy, and the optical path may be enlarged.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1a shows an embodiment of a metamorphic buffer in connection with a two-junction semiconductor solar cell;

FIG. 1b shows the progression of the lattice constant for the two-junction semiconductor solar cell illustrated in FIG. 1a;

FIG. 1c shows the progression of the doping for the first specific embodiment of the buffer illustrated in FIG. 1a;

FIG. 2a shows an embodiment of the metamorphic buffer;

FIG. 2b shows the progression of the doping for the second specific embodiment of the metamorphic buffer illustrated in FIG. 2a;

FIG. 2c shows the progression of the hardness for the second specific embodiment of the buffer illustrated in FIG. 2a;

FIG. 3a shows an embodiment of the metamorphic buffer;

FIG. 3b shows the progression of the doping for the third specific embodiment of the metamorphic buffer illustrated in FIG. 3a; and FIG. 3c shows an alternative progression of the doping for the third specific embodiment of the buffer illustrated in FIG. 3a.

DETAILED DESCRIPTION

Figures 1A, 1B, 1C:
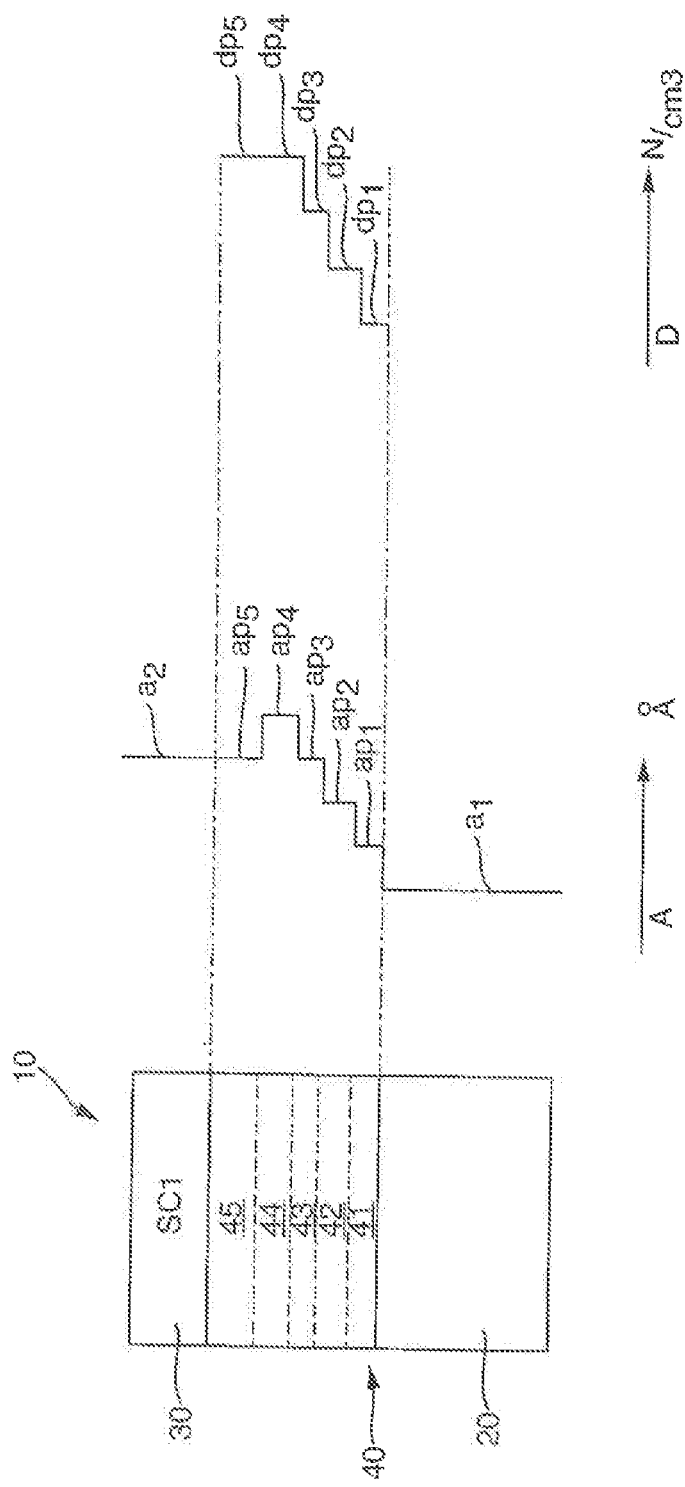

The illustration in FIG. 1 shows a solar cell stack 10, which comprises a first semiconductor solar cell 20 and a second semiconductor solar cell 30 and a metamorphic buffer 40 formed between semiconductor solar cell 20 and a second semiconductor solar cell 30.

First semiconductor solar cell 20 has a p-n junction made of a first material, which has a first lattice constant a1 and a first bandgap energy Eg1. Second semiconductor solar cell 30 has a p-n junction made of a second material, which has a second lattice constant a2 and a second bandgap energy Eg2. Second lattice constant a2 is bigger than first lattice constant a1. The solar radiation enters through second semiconductor solar cell 30 and subsequently penetrates the buffer, after which it strikes first semiconductor solar cell 20. In one specific embodiment, which is not shown, the solar radiation enters through first semiconductor solar cell 20 and subsequently penetrates the buffer, after which it strikes second semiconductor solar cell 30.

In the present case, buffer 40 includes a series of five layers 41, 42, 43, 44 and 45, first layer 41 of buffer 40 being disposed between first semiconductor solar cell 20 and second layer 42 of buffer 40, and third layer 43 of buffer 40 being disposed between second layer 42 of buffer 40 and fourth layer 44 of buffer 40, and fourth layer 44 of buffer 40 being disposed between third layer 43 of buffer 40 and fifth layer 45 of buffer 40, and fifth layer 45 of buffer 40 being disposed between fourth layer 44 of buffer 40 and second semiconductor solar cell 30. In one specific embodiment, which is not shown, metamorphic buffer 40 includes six or more layers. In another specific embodiment, which is also not shown, buffer 40 includes three or four layers.

The illustration in FIG. 1b show the progression of lattice constant A in unit Å for the solar cell stack of the two-junction semiconductor solar cell 10 illustrated in FIG. 1a. Only the differences from the specific embodiment show in the illustration in FIG. 1 are explained below. First semiconductor solar cell 20 has first lattice constant 1a, first lattice constant 1a being constant for entire first semiconductor solar cell 20.

At the transition from first semiconductor solar cell 20 to first layer 41 of buffer 40, lattice constant A jumps to a lattice constant ap1 of first layer 41, lattice constant ap1 of first layer 41 being bigger than lattice constant a1 of the first semiconductor solar cell 20.

At the transition from the first layer 41 to second layer 42, lattice constant A jumps to a lattice constant ap2 of second layer 42, which is bigger than lattice constant ap1 of first layer 41, lattice constant A increasing by at least 0.003 Å in each case from layer to layer of buffer 40.

At the transition from second layer 42 to third layer 43, lattice constant A jumps to a lattice constant ap3 of third layer 43, which is bigger than lattice constant ap2 of second layer 42.

At the transition from third layer 43 to fourth layer 44, lattice constant A jumps to a lattice constant ap4 of fourth layer 44, which is bigger than lattice constant ap3 of third layer 43.

At the transition from fourth layer 44 to fifth layer 45, lattice constant A jumps to a lattice constant ap5 of fifth layer 45, which is smaller than lattice constant ap4 of fourth layer 44, lattice constant ap5 of fifth layer 45 being the same size as second lattice constant a2 of second semiconductor solar cell 30. In that the lattice constant of fourth layer 44 is the biggest within buffer 40 and, in particular, is bigger than second lattice constant a2, a high relaxation of the buffer is achieved. Lattice constant a1 of first semiconductor solar cell 20 is also at least 0.008 Å smaller than lattice constant a2 of second semiconductor solar cell 30.

The illustration in FIG. 1c shows the progression of a doping D in unit $N/cm^{-3}$ for the layers of metamorphic buffer 40 illustrated in FIG. 1a. Only the differences from the specific embodiment shown in the illustrations in FIGS. 1a and 1b are explained below. It should be noted that, upon a change in doping D between the layers of the buffer, the difference in concentration is at least greater than 4E17 $N/cm^{-3}$.

Based on a first low concentration or an intrinsic concentration of dopants dp1 in first layer 41 of buffer 40, at the transition from first layer 41 to second layer 42, doping D jumps to a doping dp2 of second layer 42, which is higher than doping dp1 of first layer 41.

At the transition from second layer 42 to third layer 43, doping D jumps to a doping d3 of third layer 43, which is higher than doping dp2 of second layer 42

At the transition from third layer 43 to fourth layer 44, doping D jumps to a doping d4 of fourth layer 44, which is higher than doping dp3 of third layer 43. Hereafter, doping d5 of fifth layer 45 remains at the level of fourth layer 44. In other words, there is no difference in the concentration of the dopants between fourth layer 44 and fifth layer 45, and dp4=dp5.

The illustration in FIG. 2a shows a second specific embodiment of metamorphic buffer 40. Only the differences from the preceding specific embodiments are explained below. Once again, buffer 40 includes a total of five layers 41, 42, 43, 44 and 45.

The illustration in FIG. 2b shows the progression of doping D for the second specific embodiment of metamorphic buffer 40 illustrated in FIG. 2a. Only the differences from the preceding embodiments are explained below. Doping D increases in jumps of 1E16 $N/cm^3 < \Delta D < 5e17\ N/cm^3$ from one layer of buffer 40 to a subsequent layer of buffer 40, up to and including fourth layer 44. However, dopings dp4 and dp5 for the last two layers 44 and 45 of buffer 40 then remain constant.

The illustration in FIG. 2c shows the progression of hardness H for the second specific embodiment of buffer 40 illustrated in FIG. 2a. Hardness H increases in jumps from first layer 41 to second layer 42, and from second layer 42 to third layer 43, and from third layer 43 to fourth layer 44 of buffer 40, hardness H remaining constant for the last two layers 44 and 45 of buffer 40.

The illustration in FIG. 3a shows a third specific embodiment of metamorphic buffer 40. Only the differences from the preceding embodiments are explained below. In the present case, fourth layer 44 and fifth layer 45 each have a thicker design than the other layers of buffer 40.

The illustration in FIG. 3b shows the progression of doping D for the third specific embodiment of the metamorphic buffer illustrated in FIG. 3a. Only the differences from the preceding embodiments are explained below. Doping D increases in jumps of 1E16 $N/cm^3 < \Delta D < 5e16\ N/cm^3$ from one layer of buffer 40 to a subsequent layer of buffer 40, up to and including third layer 43. The doping jumps to a greater concentration by at least five times the concentration of the dopant in layer 43, from third layer 43 to fourth layer 44, and the doping increases by a factor of at least 10 from third layer 43 to doping dp4 of fourth layer 44.

The illustration in FIG. 3c shows the progression of alternative doping D for the third specific embodiment of the metamorphic buffer illustrated in FIG. 3a. Only the differences from the preceding embodiments are explained below. Doping D is at a constant low or intrinsic level from first layer 41 up to and including third layer 43, and jumps to a greater concentration by at least 1E18 $N/cm^{-3}$ from third layer 43 to forth layer 44.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell stack comprising:
   a first semiconductor solar cell having a p-n junction made of a first material which has a first lattice constant, the first semiconductor solar cell consisting of Ge or GaAs;
   a second semiconductor solar cell having a p-n junction made of a second material which has a second lattice constant, the first lattice constant being at least 0.008 Å smaller than the second lattice constant, the second semiconductor solar cell consisting of InGaAs or InGaP; and
   a metamorphic buffer formed between the first semiconductor solar cell and the second semiconductor solar cell, the metamorphic buffer including a series of at least five layers, each lattice constant of the at least five layers of the metamorphic buffer increasing in a direction of the second semiconductor solar cell,
   wherein each lattice constant of the at least five layers of the metamorphic buffer is larger than the first lattice constant,
   wherein the metamorphic buffer adjoins the first semiconductor solar cell and the second semiconductor solar cell,
   wherein the dopant concentration within the at least five layers of the metamorphic buffer is less than $1E^{19}\ N/cm^3$ throughout the metamorphic buffer,
   wherein a lattice constant of a last layer one of the series of at least five layers of the metamorphic buffer in a direction of the second semiconductor solar cell is greater than the lattice constant of the second semiconductor solar cell,
   wherein the metamorphic buffer comprises an additional layer disposed between the last layer of the series of layers of the metamorphic buffer and the second semiconductor solar cell,
   wherein the lattice constant of the additional layer is equal to a lattice constant of the second semiconductor solar cell,
   wherein the hardness increases in steps from a first layer to a second layer and from the second layer to a third layer, and from the third layer to a fourth layer of the metamorphic buffer, and
   wherein the first semiconductor solar cell, the second semiconductor solar cell and the metamorphic buffer are monolithically integrated.

2. The solar cell stack according to claim 1, wherein the at least five layers of the metamorphic buffer have a doping, a difference in a dopant concentration ($N/cm^{-3}$) between each of the layers being greater than 4E17 $N/cm^3$.

3. The solar cell stack according to claim 1, wherein the lattice constant of the metamorphic buffer increases layer by layer by at least 0.003 Å in the direction of the second semiconductor solar cell.

4. The solar cell stack according to claim 1, wherein the additional layer has a same dopant concentration as the last layer of the series of at least five layers of the metamorphic buffer.

5. The solar cell stack according to claim 1, wherein the at least five layers of the metamorphic buffer have an n-doping or a p-doping.

6. The solar cell stack according to claim 1, wherein, in the metamorphic buffer, Zn and/or C and/or Mg and/or Be is/are provided as the p-dopants, and Si and/or Te and/or Se is/are provided as the n-dopants.

7. The solar cell stack according to claim 1, wherein the metamorphic buffer includes more than five layers.

8. The solar cell stack according to claim 1, wherein two layers of the metamorphic buffer have a same concentration of dopants.

9. The solar cell stack according to claim 1, wherein the metamorphic buffer is not part of a p-n junction of a tunnel diode.

10. The solar cell stack according to claim 1, further comprising a substrate layer comprising Ge or GaAs.

11. The solar cell stack according to claim 1, wherein an optical rear-view mirror is formed.

12. The solar cell stack according to claim 1, wherein a hardness of each of the at least five layers of the metamorphic buffer increases from the first semiconductor solar cell towards the second semiconductor solar cell.

13. The solar cell stack according to claim 1, wherein the concentration of the dopant increases in steps from $1E^{16}$ $N/cm^3 < \Delta D < 5E^{16}$ $N/cm^3$ from one layer of the series of at least five layers of the metamorphic buffer to a subsequent layer of the series of at least five layers of the metamorphic buffer up to and including a third layer of the series of at least five layers of the metamorphic buffer, and the concentration of the dopant, proceeding from the third layer to a fourth layer of the series of at least five layers of the metamorphic buffer, increases to a greater concentration by at least five times the concentration of the dopant in the third layer, or the concentration of the dopant increases in steps from $1E^{16}$ $N/cm^3 < \Delta D < 5E^{17}$ $N/cm^3$ from one layer of the series of at least five layers of the metamorphic buffer to a subsequent layer of the series of at least five layers of the metamorphic buffer up to and including the fourth layer.

14. The solar cell stack according to claim 1, wherein a hardness remains constant for a last two layers of the at least five layers of the metamorphic buffer.

15. The solar cell stack according to claim 1, wherein the concentration of the dopant increases in steps from $1E^{16}$ $N/cm^3 < \Delta D < 5E^{16}$ $N/cm^3$ from one layer of the series of at least five layers of the metamorphic buffer to a subsequent layer of the series of at least five layers of the metamorphic buffer up to and including a third layer of the series of at least five layers of the metamorphic buffer.

16. The solar cell stack according to claim 1, wherein the concentration of the dopant, proceeding from the third layer to a fourth layer of the series of at least five layers of the metamorphic buffer, increases to a greater concentration by at least five times the concentration of the dopant in the third layer.

17. The solar cell stack according to claim 1, wherein the concentration of the dopant increases in steps from $1E^{16}$ $N/cm^3 < \Delta D < 5E^{17}$ $N/cm^3$ from one layer of the series of at least five layers of the metamorphic buffer to a subsequent layer of the series of at least five layers of the metamorphic buffer up to and including the fourth layer.

18. The solar cell stack according to claim 1, wherein the hardness increases in steps from sequentially through each layer of the metamorphic buffer.

19. The solar cell stack according to claim 1, wherein the hardness increases in steps from sequentially through each immediately adjacent layer of the metamorphic buffer.

* * * * *